(12) United States Patent
Knechten et al.

(10) Patent No.: US 11,964,485 B2
(45) Date of Patent: Apr. 23, 2024

(54) INTERCONNECTION STRUCTURE FOR A PRINT HEAD

(71) Applicant: CANON KABUSHIKI KAISHA, Tokyo (JP)

(72) Inventors: Karel Knechten, Broekhuizen (NL); Reinier Pannekoek, Helden (NL)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/575,526

(22) Filed: Jan. 13, 2022

(65) Prior Publication Data

US 2022/0227133 A1    Jul. 21, 2022

(30) Foreign Application Priority Data

Jan. 21, 2021   (EP) .................................. 21152840

(51) Int. Cl.
*B41J 2/14*        (2006.01)
*H10N 30/87*       (2023.01)

(52) U.S. Cl.
CPC .......... *B41J 2/1433* (2013.01); *H10N 30/875* (2023.02); *B41J 2002/14491* (2013.01)

(58) Field of Classification Search
None
See application file for complete search history.

(56) References Cited

U.S. PATENT DOCUMENTS

| 2004/0119787 | A1  | 6/2004  | Mori |
| 2006/0132545 | A1  | 6/2006  | Tanikawa |
| 2006/0170737 | A1* | 8/2006  | Ito ......................... H05K 3/361 |
|              |     |         | 347/68 |
| 2018/0290450 | A1  | 10/2018 | Reinten |

FOREIGN PATENT DOCUMENTS

EP         3362289 A1    8/2018

* cited by examiner

*Primary Examiner* — Erica S Lin
(74) *Attorney, Agent, or Firm* — Canon U.S.A., Inc. I.P. Division

(57) ABSTRACT

A print head includes a body, holding a droplet jetting device, a flexible electrical connection element, and an adhesive covering and securing first and second contact pad structures together. The droplet jetting device has an actuator for jetting a droplet of liquid from a nozzle of the droplet jetting device. The actuator is in electrical connection to the first contact pad structure. The flexible electrical connection element has, at one end, the second contact pad structure, which is mounted onto the first contact pad structure. The first and second contact pad structures each have an interface surface which contacts the interface surface of the other to form an electrical connection. At least one of the first contact pad structure and the second contact pad structure includes a recessed portion as compared to a wider portion positioned between the recessed portion and the interface surface.

13 Claims, 4 Drawing Sheets

INTERCONNECTION STRUCTURE FOR A PRINT HEAD

BACKGROUND

Field

The disclosure relates to a print head having one or more droplet jetting devices as well as to a method for connecting a droplet jetting device to a controller.

Description of the Related Art

An ink jet printer typically has an array of narrowly spaced droplet forming devices each of which has an electro-mechanical transducer, e.g. a piezoelectric actuator, for creating acoustic pressure waves that result in the ejection of ink droplets from nozzles of the droplet jetting devices. The print head or at least an array of ejection units of the print head may be constituted by a MEMS chip (Micro-Electro-Mechanical System) which is manufactured by means of photolithographic techniques. Such a print head is known from e.g. EP 3362289 A1. In order to print an image, the transducers in the MEMS chip must be controlled individually by means of an electronic controller that is connected to the chip via a connection element in the form of a printed circuit sheet. The interconnection structure discussed here has the purpose to connect each individual transducer to a track on the printed circuit sheet which connects the chip to the electronic controller. Typically, the printed circuit sheet is a flexible sheet, e.g. a so-called FPC (Flexible Printed Circuit).

Since an ink jet printer operates with liquid ink and the electrical connections of the interconnection structure are sensitive to moisture and ink, respectively, it is necessary to protect the electrical connections on the connection surface of the chip against the ingress of ink. Additionally, the electrical connections are sensitive to damage due to the displacement of the flexible sheet during print head production and/or operation. Pulling forces on the sheet may cause one or more electrical connections in the interconnection structure to disconnect, which prevents the controller from actuating the respective transducers. This is known as nozzle failure and may result in visible artefacts in the printed image. Poor bonding at the interconnection structure thus reduces the reliability of the print head.

SUMMARY

Disclosed is a reliable print head, an interconnection structure, and a method.

According to an aspect of the present disclosure, a print head includes a body holding at least one droplet jetting device provided with an actuator for jetting a droplet of liquid from a nozzle of the at least one droplet jetting device, wherein the actuator is in electrical connection to a first contact pad structure positioned on an outer surface of the body, a flexible electrical connection element having a second contact pad structure at one end, wherein the second contact pad structure is mounted onto the first contact pad structure, and the first and second contact pad structures each have an interface surface which contacts the interface surface of the other of the first and second contact pad structures to form an electrical connection, and an adhesive covering the first and second contact pad structures and securing them together, wherein at least one of the first contact pad structure and the second contact pad structure includes a recessed portion as compared to a wider portion positioned between the recessed portion and the interface surface.

In an example, a first and/or second contact pad structure are a recessed portion. The wider portion is positioned between the recessed portion and the interface surface. The respective contact pad structure has been provided with one or more recesses which results in the recessed portion being narrower than the wider portion. The recessed portion and the wider portion are at different positions in a direction perpendicular to the interface surface and/or the outer surface of the body on which the first contact pad structure is provided. The adhesive inwardly extends towards a center of the respective contact pad structure beyond the contour or circumference of the wider portion, either locally or around the full circumference. The wider portion thereby forms a protrusion which extends over the portion of the adhesive in the recess. The adhesive is thereby effectively 'anchored' or 'hooked' in the recess against forces in the perpendicular direction by the portion of adhesive underneath the wider portion. This result in a secure contact between the first and second contact pad structures, which is resistant against forces exerted on the connection element. The bonding is particularly effective as it may be applied to each individual bond pad structure. This results in a higher yield for manufacturing print heads as well as a more reliable operation and lifetime of individual print heads.

In an embodiment, a cross-sectional area of the recessed portion parallel to the interface surface is smaller than a corresponding cross-sectional area of the wider portion. The cross-sections are preferably taken parallel to the interface surface and/or the outer surface on which the first contact pad structure is positioned.

In an embodiment, the wider portion extends over a recess adjacent the recessed portion, the recess being substantially filled with adhesive. The recessed portion is narrowed with respect to the wider portion due to the presence of at least one recesses positioned at the recessed portion. The recess and the recessed portion are positioned at the same or similar positions or heights in the direction perpendicular to interface surface. The interface surface is preferably parallel to the outer surface of the body. The wider portion is positioned 'higher' than the recessed portion and the recess, i.e. further removed from the outer surface, in a direction moving away from the interface surface. Due to its larger cross-sectional area the wider portion extends over the recess. During its application the liquid adhesive has flowed into the recess, such that a portion of the adhesive is 'underneath' a section of the wider portion, which extends over the recess. After hardening this portion of the adhesive form a bump or protrusion, which is trapped by the overhanging section of the wider portion, at least in the direction perpendicular to the outer surface of the body. This adhesive anchor portion preferably extends along two or more sides of the respective contact pad structure. In a preferred embodiment, the recess and thus the adhesive anchor portion extend circumferentially around the respective contact pad structure, specifically along the full circumference. This further improves the holding together of the first and second contact pad structures.

In an embodiment, when viewed parallel to outer surface, the adhesive extends beyond a circumference of a maximum cross-sectional area of the respective contact pad structure towards a center of the first contact pad structure. Preferably, the inner circumference of the adhesive anchor portion is smaller than that of the wider portion, specifically the circumference of the maximum cross-sectional area of the respective contact pad structure. The adhesive anchor portion locally includes an opening, the area of which is smaller than that of the maximum cross-sectional area. This prevents the adhesive anchor portion from passing over the wider portion, securing the first and second contact pad structures together.

In an embodiment, a portion of the respective contact pad structure tapers in a direction away from the interface surface. The portion may be the bottom side of the first contact pad structure facing the outer surface of the body. The recessed portion is formed by the tapered bottom portion, which tapers or narrows from the wider portion towards the outer surface of the body. Alternatively or additionally, the second contact pad structure may further be tapered towards the connection element. A tapered contact pad structure is relatively easy to manufacture using MEMS lithographic deposition and etching techniques.

In an embodiment, the actuator is connected to the first contact pad structure via a lead extending at least partially over the body, the lead being narrower than the first contact pad structure. The lead is formed of a conductive material for transmitting an energizing signal or pulse to the actuator. In consequence of the high resolution determined by the number of droplet jetting devices per unit length (e.g. dpi), the leads are relatively narrow, making it difficult to align the second contact pad structures directly thereon. The contact area is enlarged by having the leads extend into first contact pad structures.

In an embodiment, the first and second contact pad structures are in pressure contact with one another. The contacts pad are preferably pressed together to achieve an electrical connection. No (or at least little) adhesive is preferably present between the interface surfaces of the first and second contact pad structures. After the pressure contact has been established all contact pad structures are covered with an adhesive. Adhesive may be applied to pairs of first and second contact pad structures individually, in groups thereof, or in the form of a single adhesive coating or layer for all contact pad structures. This allows for a relatively easy manufacturing of the print head according to the present disclosure.

In an embodiment, the flexible electrical connection element extends away from the first contact pad structure in a direction perpendicular to the interface surface. The flexible connection element, preferably in the form of a flexible printed sheet provided with conductive tracks, extends away from the first contact pad structure upwards from the outer surface of the body towards a controller positioned remote from the droplet jetting device. The outer surface is preferably perpendicular to the droplet jetting direction of the droplet jetting, which is generally the vertical direction.

In an embodiment, the area of a contact surface between the first contact pad structure and the outer surface of the body is smaller than a maximum cross-sectional area of the first contact pad structure. The contact surface is the bottom surface of the first contact pad structure. The contact surface is narrowed compared to a wider portion of the first contact pad structure, positioned higher up in the perpendicular direction or more remote from the outer surface. In an embodiment, the contact surface is smaller than the interface surface of the first contact pad structure.

The present disclosure further relates to interconnection structure for a print head, having a first contact pad structure provided on a contact surface, a flexible electrical connection element having a second contact pad structure at one end, the second contact pad structure being mounted onto the first contact pad structure, the first and second contact pad structures each having an interface surface which contacts the interface surface of the other to form an electrical connection, an adhesive covering the first and second contact pad structures and securing them together, wherein at least one of the first contact pad structure and the second contact pad structure includes a recessed portion as compared to a wider portion, which wider portion is positioned between the recessed portion and the interface surface. The interconnection structure and its components may be embodied as in any of the above described embodiments.

The present disclosure further relates to a method for connecting a droplet jetting device to a controller, that includes forming a first contact pad structure on a contact surface, such that a recess accessible in a direction parallel to the contact surface is formed in at least one side of the first contact pad structure, positioning a second contact pad structure of a flexible electrical connection element on the first contact pad structure, wherein one of the first and second contact pad structures is provided on a body holding a droplet jetting device and the other is provided at the end of a flexible connection element, applying adhesive to the first and/or second contact pad structures for securing these together, wherein adhesive flows into the at least one recess.

The first contact pad structure herein may be positioned on the droplet jetting device or on the connection element and may be shaped or formed as described in any of the previously discussed embodiments. After applying the adhesive, the adhesive is hardened and/or cured including a portion of the adhesive, which is present in the recess. The adhesive portion in the recess is positioned between a wider portion of the first contact pad structure and the outer surface of the body. In its hardened form this adhesive portion acts as an anchor which prevents the second contact pad structure from breaking contact with the first contact pad structure. It will be appreciated that adhesive may be applied to either one or both contact pad structures before and/or after bringing the contact pad structures together. During the pressing together of the contact pad structures, the adhesive is driven out of the interface between the contact pad structure to enable the electrical connection.

In an embodiment, the step of applying the adhesive includes the adhesive at least partially filling the recess. The recess is at least partially filled with adhesive. In a further step, the adhesive may be hardened by a suitable process, such as drying or curing. A portion of the adhesive inside the recess is hardened cured as well. The adhesive is preferably selected such that it adheres or bonds well to the flexible connection element and outer surface, which contributes to a secure holding. Providing each first contact pad structure with a recess provides an additional holding per individual bond pad.

In embodiment, the first contact pad structure is formed on a removable layer, and the at least one recess is formed by at least partially removing the removable layer. The removable layer is preferably etchable. The removable layer may be applied, such that the first contact pad structure upon its formation is formed with recesses and/or such that the removable layer is partially removable below the first contact pad structure, such that its bottom surface is partially exposed.

Further scope of applicability of the present disclosure will become apparent from the detailed description given hereinafter. However, it should be understood that the detailed description and specific examples, while indicating preferred embodiments of the present disclosure, are given by way of illustration only, since various changes and modifications within the spirit and scope of the present disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure, and wherein.

DESCRIPTION OF THE EMBODIMENTS

Figure 1:
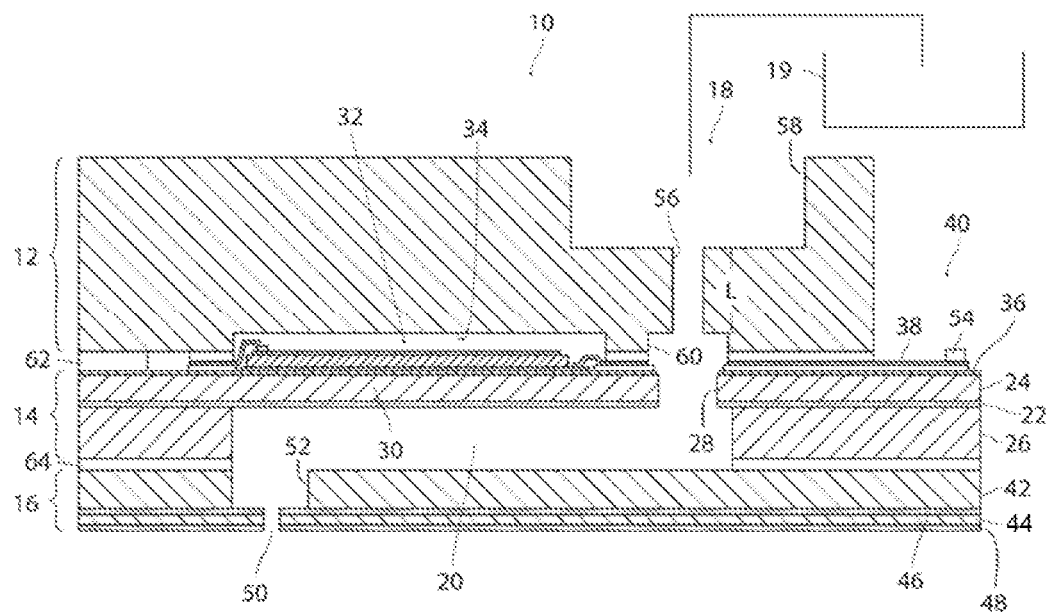
FIG. 1 is a sectional view of a droplet jetting device.

The present disclosure will now be described with reference to the accompanying drawings, wherein the same reference numerals have been used to identify the same or similar elements throughout the several views.

FIG. 1 shows a single droplet jetting device 10 which is one of a plurality of jetting devices that have an identical design and are integrated into a common MEMS chip that may be used in an ink jet print head, for example. The MEMS chip and, accordingly, the jetting devices 10 have a layered structure comprising as main layers a distribution layer 12, a membrane layer 14 and a nozzle layer 16.

The distribution layer 12 is a single silicon layer having a relatively large thickness of at least 200 micron, preferably 300 micron and more preferably more than 400 micron. In the present example, the thickness is 400 micron. The distribution layer 12 defines an ink supply line 18 which has been shown only schematically in FIG. 1 through which liquid ink may be supplied from an ink reservoir 19 to a pressure chamber 20 that is formed on the bottom side of the membrane layer 14. The ink reservoir 19 which has been shown only schematically in FIG. 1 is common to a plurality of jetting devices and is formed separately from the distribution layer 12 on the top side of the distribution layer, i.e. on the side opposite to the membrane layer 14. This has the advantage that the distribution layer 12 is not weakened by any cavity forming the reservoir.

The membrane layer 14 is obtained from a SOI wafer having an insulator layer 22 and silicon layers 24 and 26 formed on both sides thereof. In this embodiment, the final membrane layer 14 may have a thickness of about 75 micron. The pressure chamber 20 is formed in the bottom silicon layer 26. The top silicon layer 24 and the insulator layer 22 form a continuous flexible membrane 30 with uniform thickness which extends over the entire area of the MEMS chip and is pierced by an opening 28 only at the position of the ink supply line 18 so as to connect the ink supply line to the pressure chamber 20. A piezoelectric actuator 32 is formed on the top side of the part of the membrane 30 that covers the pressure chamber 20. The actuator 32 is accommodated in an actuator chamber 34 formed at the bottom side of the distribution layer 12.

An electrically insulating silicon oxide layer 36 insulates the actuator 32 and its electrodes from the silicon layer 24 and carries electric leads 38 arranged to contact the electrodes on the top and bottom sides of the actuator 32. The leads 38 are exposed and contactable in a contact region 40 where the distribution layer 12 has been removed.

The nozzle layer 16 is obtained from a double-SOI wafer and has a top silicon layer 42 and a thinner silicon layer 44 interposed between two insulator layers 46 and 48. In this embodiment, the final nozzle layer may have a thickness of about 125 micron. A nozzle 50 is formed in the two insulator layers 46 and 48 and in the silicon layer 44 intervening between them, so that the thickness of these three layers defines the length of the nozzle. The top silicon layer 42 of the nozzle layer 16 defines a feedthrough 52 which connects the pressure chamber 20 to the nozzle 50 but has a cross-section that is significantly larger than that of the nozzle 50.

It will be understood that the droplet jetting devices 10 of the MEMS chip are arranged such that their nozzles 50 define a nozzle array consisting for example of one, two or even more parallel nozzle lines with uniform nozzle-to-nozzle spacings which will determine the spatial resolution of the print head. Within the contact region 40, each of the leads 38 can be contacted, e.g. via contacts pads 54 formed as bumps, so that energizing signals in the form of electric voltage pulses may be applied individually to each actuator 32. When a voltage is applied to the electrodes of the actuator 32, the piezoelectric material of the actuator is caused to deform in a bending mode, thereby flexing the membrane 30 and consequently changing the volume of the pressure chamber 20. Typically, a voltage pulse is applied to the actuator to cause a deformation that increases the volume of the pressure chamber 20, so that ink is sucked-in from the supply line 18. Then, when the voltage pulse drops off or changes into a pulse with opposite polarity, the volume of the pressure chamber 20 is decreased abruptly, so that an acoustic pressure wave is generated which propagates through the pressure chamber 20 and through the feedthrough 52 to the nozzle 50, with the result that a droplet of ink is jetted-out from the nozzle 50.

In the design that is proposed here, the relatively large thickness of the distribution layer 12 is utilized for arranging a restrictor 56 to extend vertically through the distribution layer 12, from a feedthrough 58 to a feedthrough 60. That is, the longitudinal axis of the restrictor 56 is normal to the plane of the layers 12, 14 and 16 of the device. This permits a compact design with small dimensions of the jetting device 10 in the plane of the layers 12-16. This has the advantage that a larger number of MEMS chips can be produced from a single wafer having a given diameter. Further, the compact design permits a close packing of the individual devices 10 within the chip, and therewith a high nozzle density and, consequently, a high spatial resolution of the print head. Another advantage of the vertical arrangement of the restrictor 56 is that the length "L" and cross-sectional area of the restrictor can be controlled with high precision by using well-established lithographic techniques.

As has been shown in FIG. 1, the distribution layer 12 is connected to the membrane layer 14 by a bonding layer 62. Similarly, the membrane layer 14 is connected to the nozzle layer 16 by a bonding layer 64. The bonding layers 62 and 64 being layers of adhesive, their physical properties are difficult to control. However, in the design that has been proposed here, the bonding layers are arranged such that their properties do not significantly affect any of the critical parameters of the design.

Figure 2:
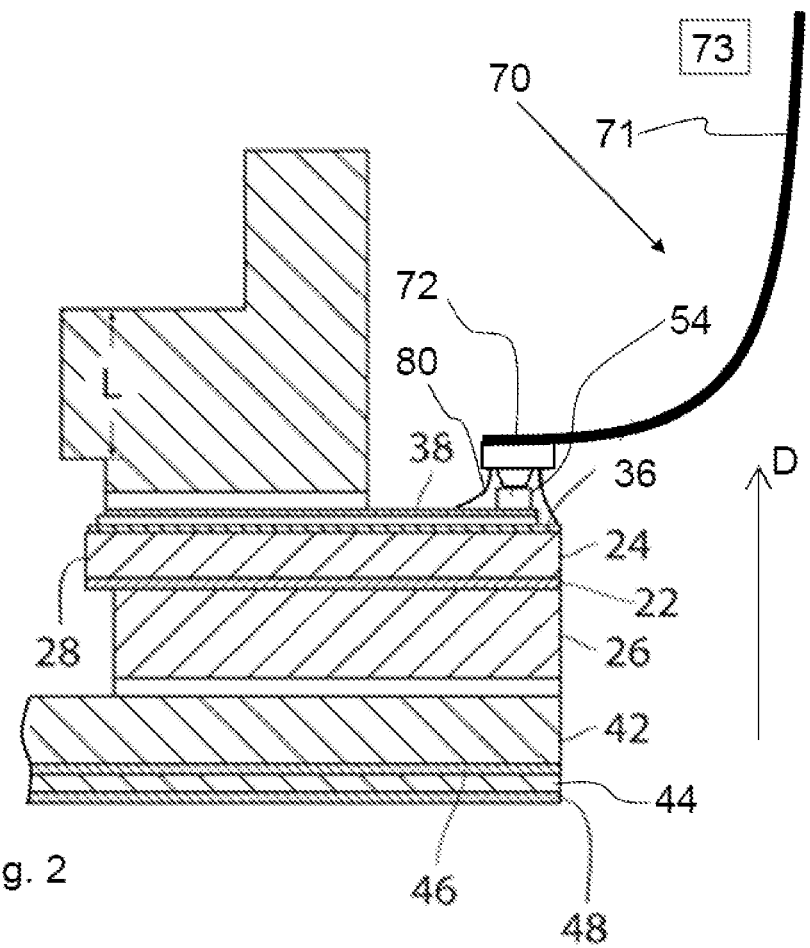
FIG. 2 is an enlarged view of the right hand side of the droplet jetting device in FIG. 1 connected to the flexible connection element.

FIG. 2 shows in more detail the right hand side of FIG. 1, where the first contact pad structure 54 is positioned on the body of the print head 10. The first contact pad structure 54 in FIGS. 1 and 2 is positioned on the top silicon layer 24, though within the present disclosure it may be positioned on any suitable position on the print head 10. The first contact pad structure 54 is electrically connected to the actuator 32 as well as to the flexible, electrical connection element 70. The connection element 70 in turn is in electrical connection to a controller 73. This electrical connection allows the controller 73 to transmit energizing signals or pulses to the actuator 32 for jetting the droplets. The connection element 70 preferably comprises a large number of parallel, conductive tracks or lines corresponding to the number of droplet jetting devices 10 in the respective print head unit. A suitable connection element 70 may be formed by a flexible printed sheet 71, which comprises a plurality of parallel conductive tracks. The connection element 70 is provided with at least one second contact pad 72 for each droplet jetting device 10 in the print head. A second or ground connection to each actuator 32 may be provided by either a common contact pad or individual pads. Additional leads and contact pad structures may be provided for additional functionality, such as sensing or detecting certain parameters of the droplet jetting device 10 during operation. This allows for sensing temperature, actuator performance, etc. The connection element 70 is flexible to allow it to be easily mounted in the print head and to reduce forces being exerted on the interconnection structure. Generally, the connection element 70 extends upwards away from the droplet jetting device 10 in the direction D. The direction D is preferably the upward vertical direction. The first and second contact pad structures 54, 72 are in contact with one another by pressing their interface surfaces (54D in FIG. 3) together. The contact pad structures 54, 72 are held together by an adhesive 80 covering both contact pad structures 54, 72. Any suitable adhesive 80 may be applied. Preferably a moisture resistant adhesive 80 is applied in such a manner that the adhesive 80 forms a protective layer over the contact pad structures 54, 72.

Figure 3:
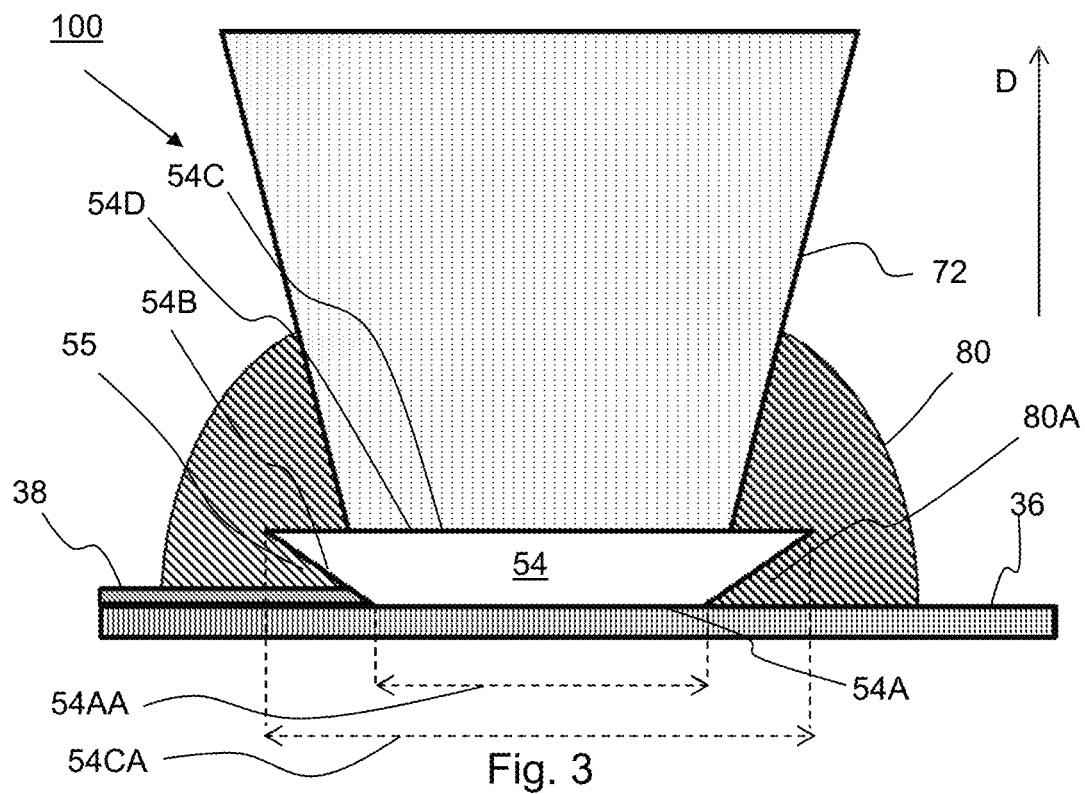
FIG. 3 is a schematic view of an embodiment of the interconnection structure according to the present disclosure.

FIG. 3 illustrates a first embodiment of the interconnection structure 100 according to the present disclosure. The first contact pad structure 54 is provided on the body 36 in electrical connection with the lead 38 extending to the actuator 32. The second contact pad structure 72 of the connection element 70 is positioned on top of the interface surface 54D of the first contact pad structure 54. Both contact pad structures 54, 72 are held together by adhesive 80. The first contact pad structure 54 is provided with one or more recesses 55 at one or more of its sides. The recess 55 locally reduces the diameter and/or cross-sectional area 54AA of the first contact pad structure 54, the cross-section being parallel to the outer surface of the body 36. The cross-sectional area 54AA of the recessed portion 54A is smaller than the respective area 54CA of a wider portion 54C of the first contact pad structure 54. In consequence the wider portion 54C is present between the recessed portion 54A and the interface surface 54D, where the second contact pad structure 72 begins. The wider portion 54C extends outwardly beyond the circumference of the recessed portion 54A. The wider portion 54C overhangs the recessed portion 54A like an outwardly extending protrusion above the recesses 55. The applied adhesive 80 has crept into the recesses 55 below the wider portion 54C (when the direction D is parallel to the upward vertical direction). The adhesive 80 in the recesses 50 forms an adhesive anchor 80A which anchors the interconnection structure 100 against upwards forces in the direction D. Such forces may be applied for example by pulling on the connection element 70. In consequence the first and second contact pad structures 54, 72 are kept in good electrical contact, ensuring a reliable operation of the droplet jetting device 10.

In FIG. 3, the recessed portion 54A is positioned at the bottom side of the first contact pad structure 54, which side contacts the body 36. The first contact pad structure 54 is shaped, specifically tapered, such that its body contact area 54AA is smaller than its maximum cross-sectional area 54CA of the wider portion 54C. The wider portion 54C in FIG. 3 is formed by the top surface of the first contact pad structure 54. The body contact area 54AA of the first contact pad structure 54 faces and/or contacts the body 36. The one or more recesses 55 in FIG. 3 are formed by respective skewed or inclined side surfaces 54B. The side surface 54B from the wider portion 54C to the recessed portion 54A curves inward towards a centre (C in FIG. 5) of the first contact pad structure 54. The curvature or shape of the side surface 54B may be determined by the manufacturing process, specifically the etching properties of the applied materials.

Figure 4:
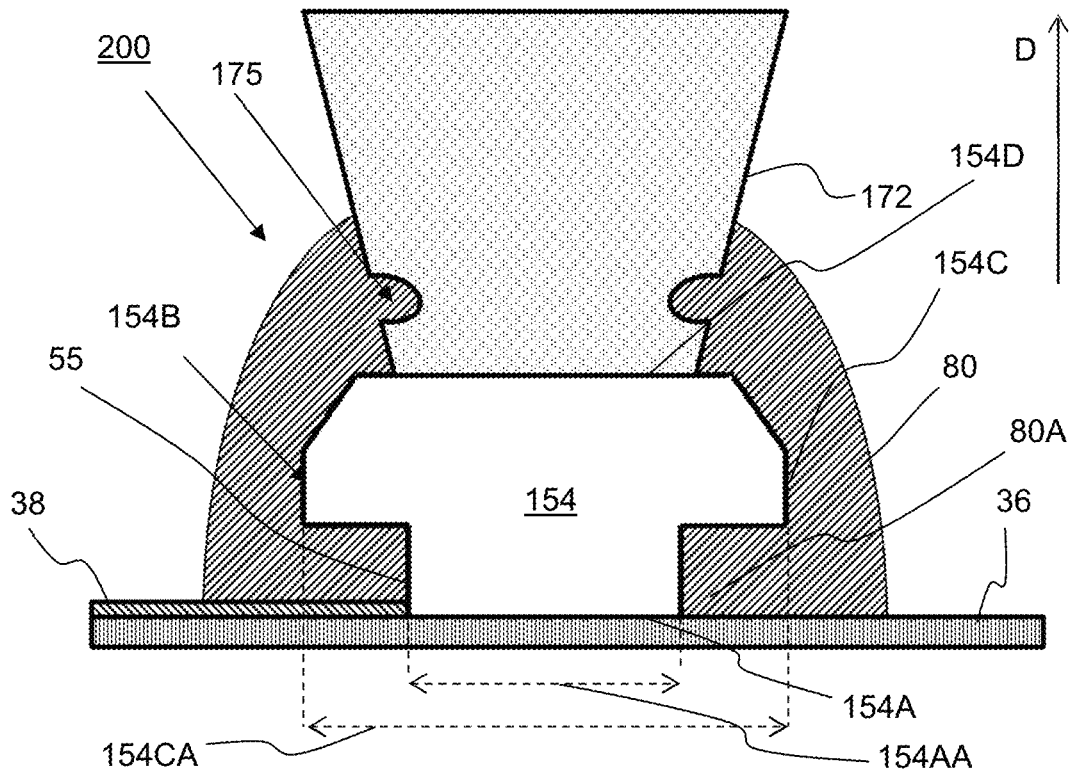
FIG. 4 is a schematic view of another embodiment of the interconnection structure according to the present disclosure.

FIG. 4 illustrates another embodiment of the interconnection structure 200 according to the present disclosure. In FIG. 4, the first contact pad structure 154 is substantially mushroom-shaped. The first contact pad structure 154 has the recessed portion 154A and the wider portion 154B. The wider portion 154B is positioned between the top surface and bottom surface 154AA of the first contact pad structure 154 in the direction D. The top portion is narrowed with respect to the wider portion 154B, which may be a result of the surface tension in the material used for the first contact pad structure 154 during its deposition process. Similarly the recesses 55 not need be positioned at the bottom of the first contact pad structure 154, but may in another embodiment be positioned between the top and bottom surface of the first contact pad structure 154, which surfaces respectively contact the body 36 and the second contact pad structure 172.

FIG. 4 further illustrates that mutatis mutandis the recessed portion may further be applied in the second contact pad structure 172 on the connection element. Similar recesses 175 as discussed for the first contact pad structure 154 may be applied in the second contact pad structure 172.

Figure 5:
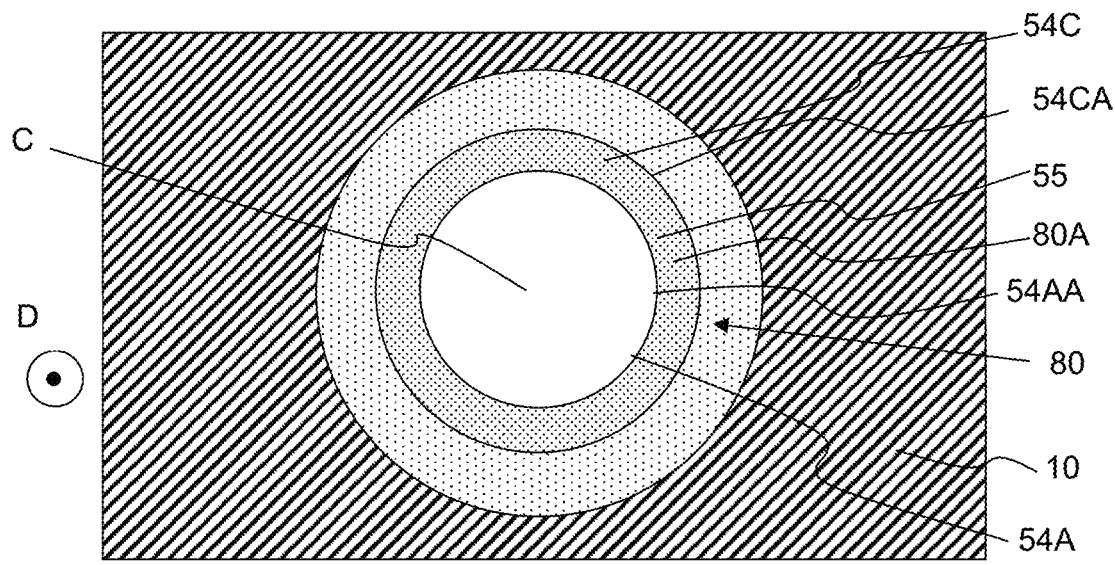
FIG. 5 is a schematic top-down, see-through view of the interconnection structure in FIG. 3 or FIG. 4.

FIG. 5 schematically illustrates the first contact pad structure 54 in a top down view in the direction D. The area 54CA of the wider portion 54C extends outwardly from the centre C of the first contact pad structure 54 beyond the area 54AA or circumference of the recessed portion, such that the recess 55 is formed. The recess 55 is positioned between the wider portion 54C and the outer surface of the body 10. The adhesive 80 is applied covering and/or surrounding the wider portion 54C and recessed portion 54A. The adhesive locally extends or protrudes into the recess 55 inwards towards the centre C beyond the circumference of the area 54CA of the wider portion 54C. Thereby, in FIG. 5, a bump or protrusion of adhesive is formed in the recess 55, which acts as an anchor 80A against forces in the direction D. The adhesive anchor 80A in the recess 55 is prevented from upward movement in the direction D due to the overhanding wider portion 54C. This effectively forms a seal which secures the first and second contact pad structures 54, 72 together.

Figure 6:
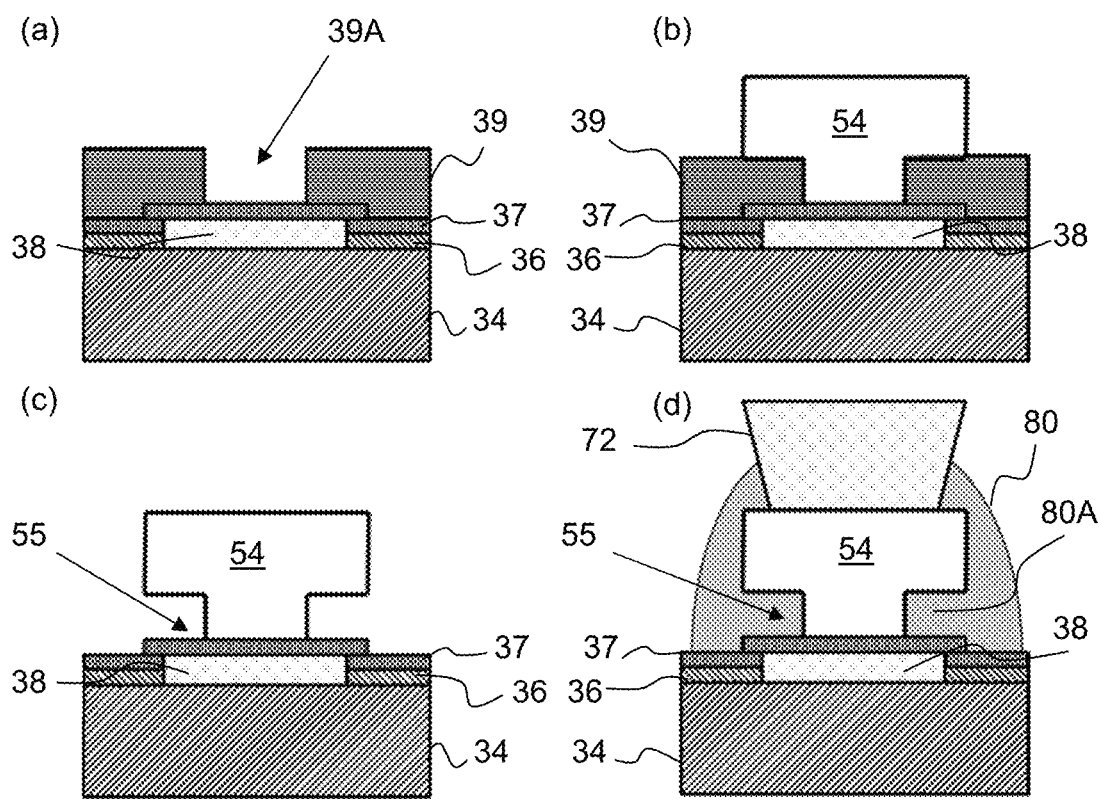
FIG. 6 is a schematic representation of the steps of an embodiment of forming the interconnection structure according to the present disclosure.

FIG. 6 illustrates schematically the steps for forming an interconnection structure 100 according to the present disclosure. A body of a droplet jetting device 10 is provided. In FIG. 6, the body of a droplet jetting device 10 is formed of a silicon substrate 34, which is provided with an isolating layer 36, which may be formed of $SiN_x$, $SiO_x$, or other suitable isolators. A lead 38 has further been deposited on the substrate 34. Suitable conductive materials may be applied for the lead 38, such as metals, specifically gold, copper, platinum, etc. or alloys thereof. Additionally a seed layer 37 may be provided to enhance the deposition and bonding of additional layers or structures. The materials for the seed layer 37 are selected in correspondence to the materials to be deposited thereon. In step (a) a removable or etchable layer or structure 39 is provided. Preferably, the removable layer 39 is formed of a photo-resistant material as commonly applied in MEMS processing. The removable layer 39 is structured, such that it comprises an opening 39A positioned over the lead 38. Subsequently in step (b) conductive material is locally deposited in the area in and around the opening 39A to form the first contact pad structure 54. Similar materials as for the lead 38 may be applied for the first contact pad structure 54. The structured or local depositing of the first contact pad structure 54 and/or the removable layer 39 may be controlled by using a mask provided with openings corresponding to the desired location for depositing the respective materials. The thickness of the first contact pad structure 54 is greater than that of the removable layer 39. The first contact pad structure 54 is further deposited in the opening 39A as well as on the adjacent top surface of the removable layer 39. This results in a mushroom shaped first contact pad structure 54. In step (c) the removable layer 39 is removed by etching, preferably photolithographic etching, creating the recess 55 on the bottom side of the first contact pad structure 54. In step (d) the connection element is connected to the droplet jetting device 10 by contacting the first and second contact pad structures 54, 72. While in contact, the adhesive 80 is applied covering the contact pad structures 54, 72. In its liquid state, the adhesive 80 creeps into the recess 55, such that it forms an anchor portion 80A which protrudes inwardly beyond the circumference of the wider portion 54C. Subsequently the adhesive 80 is hardened, thereby forming a secure bond between the first and second contact pad structures 54, 72.

Figure 7:
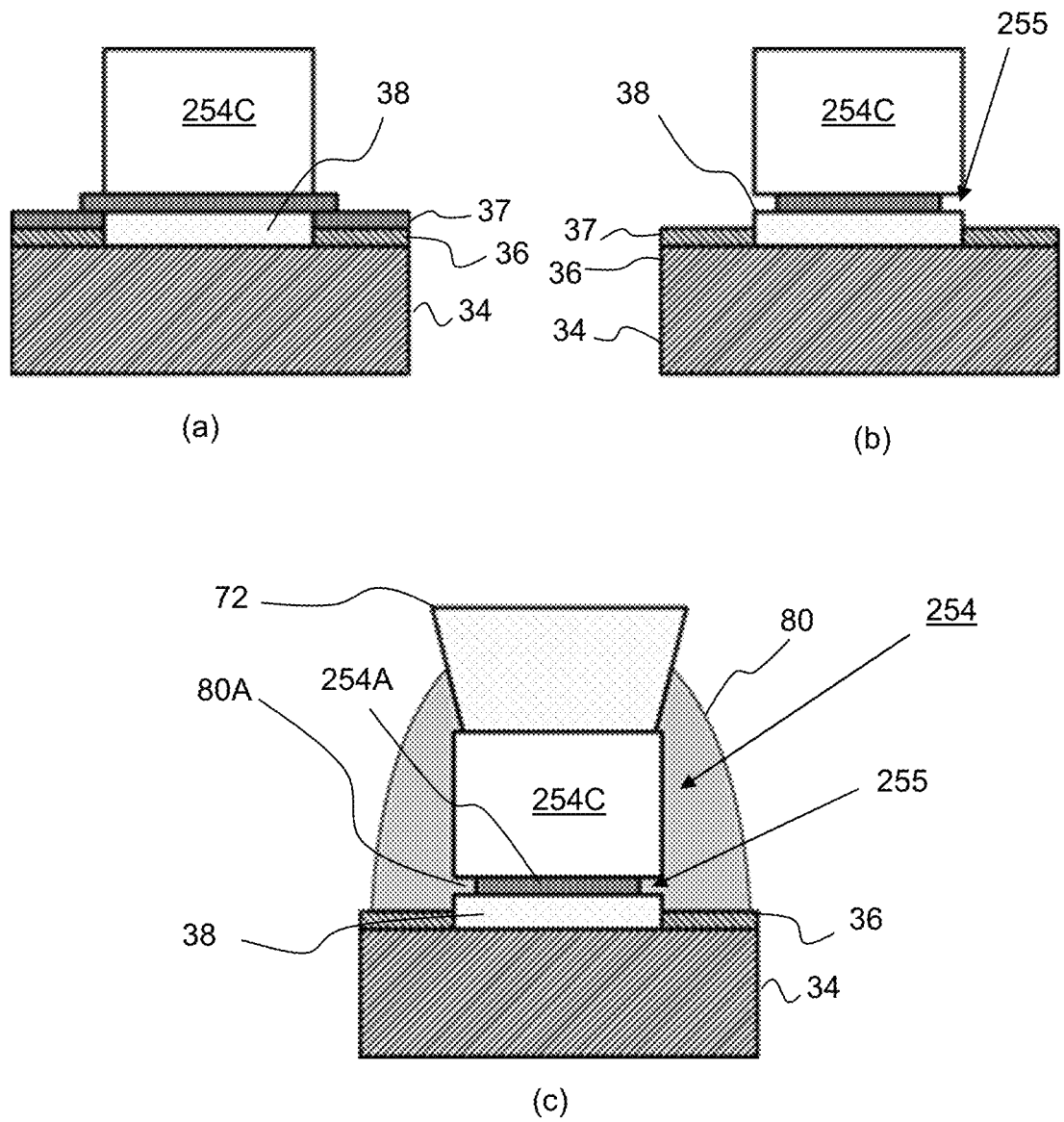
FIG. 7 is a schematic representation of the steps of another embodiment of forming the interconnection structure according to the present disclosure.

FIG. 7 is another embodiment of the method for forming the interconnection structure 100, 200 according to the present disclosure. A similar body of the droplet jetting device 10 as prior to the application of the removable layer 39 in FIG. 6 is provided. In step (a) in FIG. 7 the top contact pad portion 254C is deposited on the seed layer 37 (without first applying the removable layer 39 as in FIG. 6). In step (b) the seed layer 37 is removed by etching. The etch process conditions are selected such that so-called under-etching of the seed layer 37 below the first contact pad structure 54 occurs. The recess 255 is created by removing the seed layer 37 below the bottom edges of the top contact pad portion 254C. In step (c) the connection element is bonded to the body 10 similar to step (d) in FIG. 6. In contrast to the embodiments in FIGS. 3 to 6, the first contact pad structure 254 in FIG. 7 is formed of two different materials, specifically the seed layer portion 254A and the top portion 254C, wherein the recessed portion is formed by the etched seed layer portion 254A.

It will be appreciated that each print head may comprise a large number of droplet jetting devices 10 applied in e.g. parallel or staggered configuration. The leads of the droplet jetting devices preferably all extend to an interconnection area, where the respective first bond pads structures for the leads are grouped together. Likewise, the second contact pad structures are preferably grouped together on a single connection element, such that all droplet jetting devices may be connecting with a single alignment of the connection element on the body. The adhesive is shown in FIGS. 3 to 7 as applied individually to each contact pad pair, but may also be applied as a wider layer covering multiple pairs contact pad structures.

Although specific embodiments are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms 'comprise', 'comprising', 'include', 'including', 'contain', 'containing', 'have', 'having', and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms 'a' and 'an' used herein are intended to be understood as meaning one or more unless explicitly stated otherwise. Moreover, the terms 'first', 'second', 'third', etc. are used merely as labels, and are not intended to impose numerical requirements on or to establish a certain ranking of importance of their objects.

The present disclosure being thus described, it will be obvious that the same may be varied in many ways. Such variations are not to be regarded as a departure from the spirit and scope of the present disclosure, and all such modifications as would be obvious to one skilled in the art are intended to be included within the scope of the claims.

This application claims the benefit of European Patent Application No. 21152840.1, filed Jan. 21, 2021, which is hereby incorporated by reference herein in its entirety.

What is claimed is:

1. A print head comprising:
 a body holding at least one droplet jetting device provided with an actuator for jetting a droplet of liquid from a nozzle of the at least one droplet jetting device, wherein the actuator is in electrical connection to a first contact pad structure positioned on an outer surface of the body;
 a flexible electrical connection element having a second contact pad structure at one end, wherein the second contact pad structure is mounted onto the first contact pad structure, the first and second contact pad structures each have an interface surface, and the interface surface of one of the first and second contact pad structures contacts the interface surface of the other of the first and second contact pad structures to form an electrical connection; and a non-conductive adhesive covering the first and second contact pad structures and securing them together, wherein at least one of the first contact pad structure and the second contact pad structure respectively and/or each includes a recessed portion as compared to a wider portion positioned between the recessed portion and the interface surface.

2. The print head according to claim 1, wherein a cross-sectional area of the recessed portion parallel to the outer surface of the body is smaller than a corresponding cross-sectional area of the wider portion.

3. The print head according to claim 1, wherein the wider portion extends over a recess substantially filled with adhesive and positioned adjacent the recessed portion.

4. The print head according to claim 1, wherein, when viewed parallel to the interface surface, adhesive extends beyond a circumference of a maximum cross-sectional area of the respective contact pad structure towards a center of the respective contact pad structure.

5. The print head according to claim 4, wherein a portion of the respective contact pad structure and/or the second contact pad structure tapers in a direction away from its interface surface.

6. The print head according to claim 1, wherein the actuator is connected to the first contact pad structure via a lead extending at least partially over the body, where the lead is narrower than the first contact pad structure.

7. The print head according to claim 1, wherein the first and second contact pad structures are in pressure contact with one another.

8. The print head according to claim 1, wherein the flexible electrical connection element extends away from the first contact pad structure in a direction perpendicular to the interface surface.

9. An interconnection structure for a print head having a body holding at least one droplet jetting device provided with an actuator for jetting a droplet of liquid from a nozzle of the at least one droplet jetting device, the interconnection structure comprising:

a first contact pad structure positioned on an outer surface of the body and in electrical connection with the actuator;

a flexible electrical connection element having a second contact pad structure at one end, wherein the second contact pad structure is mounted onto the first contact pad structure, the first and second contact pad structures each have a respective interface surface, and the interface surface of one of the first and second contact pad structures contacts the interface surface of the other of the first and second contact pad structures to form an electrical connection, and a non-conductive adhesive covering the first and second contact pad structures and securing them together, wherein at least one of the first contact pad structure and the second contact pad structure respectively and/or each includes a recessed portion as compared to a wider portion positioned between the recessed portion and the interface surface.

10. A method for connecting at least one droplet jetting device of a print head to a controller, wherein the print head includes:

a body holding the at least one droplet jetting device provided with an actuator for jetting a droplet of liquid from a nozzle of the at least one droplet jetting device, wherein the actuator is in electrical connection to a first contact pad structure positioned on an outer surface of the body, a flexible electrical connection element having a second contact pad structure at one end, wherein the second contact pad structure is mounted onto the first contact pad structure, the first and second contact pad structures each have an interface surface, and the interface surface of one of the first and second contact pad structures contacts the interface surface of the other of the first and second contact pad structures to form an electrical connection, and a non-conductive adhesive covering the first and second contact pad structures and securing them together, wherein at least one of the first contact pad structure and the second contact pad structure respectively and/or each includes a recessed portion as compared to a wider portion positioned between the recessed portion and the interface surface, the method comprising:

forming the first contact pad structure on a contact surface, such that at least one recess accessible in a direction parallel to the contact surface is formed in at least one side of the first contact pad structure;

positioning the second contact pad structure the first contact pad structure, wherein the first contact pad structure is provided on the body holding the at least one droplet jetting device and the second contact pad structure is provided at the one end of the flexible electrical connection element; and applying the non-conductive adhesive to the first contact pad structure and/or to the second contact pad structure to secure them together, wherein adhesive flows into the at least one recess.

11. The method according to claim 10, wherein applying the non-conductive adhesive is such that the non-conductive adhesive at least partially fills the at least one recess.

12. The method according to claim 10, wherein applying the non-conductive adhesive further includes hardening the non-conductive adhesive including a portion of the non-conductive adhesive inside the at least one recess.

13. The method according to claim 10, wherein forming the first contact pad structure includes forming the first contact pad structure on a removable layer, and forming the at least one recess includes at least partially removing the removable layer.

* * * * *